(12) United States Patent
Xiao et al.

(10) Patent No.: US 8,941,379 B2
(45) Date of Patent: *Jan. 27, 2015

(54) ELECTROMAGNETIC WAVE DETECTION SYSTEMS AND METHODS

(75) Inventors: John Q. Xiao, Newark, DE (US); Xin Fan, Newark, DE (US)

(73) Assignee: University of Delaware, Newark, DE (US)

( * ) Notice: Subject to any disclaimer, the term of this patent is extended or adjusted under 35 U.S.C. 154(b) by 860 days.

This patent is subject to a terminal disclaimer.

(21) Appl. No.: 13/030,571

(22) Filed: Feb. 18, 2011

(65) Prior Publication Data

US 2011/0181303 A1 Jul. 28, 2011

Related U.S. Application Data

(63) Continuation-in-part of application No. 12/779,391, filed on May 13, 2010, now Pat. No. 8,476,900.

(60) Provisional application No. 61/305,729, filed on Feb. 18, 2010, provisional application No. 61/178,212, filed on May 14, 2009.

(51) Int. Cl.
*G01R 33/00* (2006.01)
*G01R 33/09* (2006.01)
(Continued)

(52) U.S. Cl.
CPC ............... *G01R 33/093* (2013.01); *B82Y 25/00* (2013.01); *G01R 33/098* (2013.01); *G01R 33/1284* (2013.01)
USPC ........................................................ 324/260

(58) Field of Classification Search
None
See application file for complete search history.

(56) References Cited

U.S. PATENT DOCUMENTS 4,305,074 A 12/1981 Barzana
4,908,694 A 3/1990 Hidaka et al.
(Continued)

FOREIGN PATENT DOCUMENTS

EP 0549911 A1 7/1993
EP 1467218 A2 10/2004
(Continued)

OTHER PUBLICATIONS

International Search Report dated Dec. 29, 2010, application No. PCT/US2010/034503.
(Continued)

*Primary Examiner* — Paresh Patel
(74) *Attorney, Agent, or Firm* — RatnerPrestia

(57) ABSTRACT

Systems and methods for detecting electromagnetic waves are disclosed. A system for use in detecting an electromagnetic wave includes an inductive device and a spintronic device. The inductive device generates an induced electromagnetic field when the inductive device receives the electromagnetic wave. The spintronic device has an impedance that changes when exposed to the induced electromagnetic field from the inductive device. The change in impedance is indicative of the electromagnetic wave received by the inductive device. Another system for use in detecting or transmitting an electromagnetic wave includes a conductive device and an inductive device. The inductive device is configured to generate an induced electromagnetic wave when the inductive device receives an electromagnetic wave passed by the conductive device. Another system for detecting electromagnetic wave permittivity or permeability of an object includes a pair of antennas and an inductive device.

15 Claims, 14 Drawing Sheets

(51) Int. Cl.
*B82Y 25/00* (2011.01)
*G01R 33/12* (2006.01)

(56) References Cited

U.S. PATENT DOCUMENTS

| | | | |
|---|---|---|---|
| 5,689,189 A | 11/1997 | Morich | |
| 6,011,981 A | 1/2000 | Alvarez et al. | |
| 6,201,259 B1 | 3/2001 | Sato et al. | |
| 6,282,069 B1* | 8/2001 | Nakazawa et al. | 360/324.2 |
| 6,304,229 B1 | 10/2001 | Lee | |
| 6,380,735 B1* | 4/2002 | Kawakami | 324/253 |
| 6,522,134 B1 | 2/2003 | Gill | |
| 6,842,368 B2 | 1/2005 | Hayakawa | |
| 6,875,985 B2 | 4/2005 | Skelton | |
| 6,914,807 B2 | 7/2005 | Nakamura et al. | |
| 6,956,269 B1 | 10/2005 | Vashchenko et al. | |
| 7,224,601 B2 | 5/2007 | Panchula | |
| 7,272,033 B2 | 9/2007 | Kim et al. | |
| 7,274,080 B1 | 9/2007 | Parkin | |
| 7,349,186 B2* | 3/2008 | Ito | 360/324.2 |
| 7,453,412 B2 | 11/2008 | Murali | |
| 7,501,985 B2 | 3/2009 | Qian | |
| 7,750,390 B2 | 7/2010 | Saito et al. | |
| 7,859,349 B2 | 12/2010 | Eyckmans et al. | |
| 8,476,900 B2* | 7/2013 | Fan et al. | 324/260 |
| 2002/0006058 A1 | 1/2002 | Nakajima et al. | |
| 2002/0096698 A1 | 7/2002 | Flatte et al. | |
| 2002/0158626 A1 | 10/2002 | Shay | |
| 2003/0048676 A1 | 3/2003 | Daughton et al. | |
| 2003/0075772 A1 | 4/2003 | Efros et al. | |
| 2004/0113188 A1 | 6/2004 | Schmidt et al. | |
| 2004/0183151 A1 | 9/2004 | Flatte et al. | |
| 2004/0246631 A1 | 12/2004 | Dieny et al. | |
| 2004/0253480 A1 | 12/2004 | Osipove et al. | |
| 2005/0021927 A1 | 1/2005 | Machida et al. | |
| 2005/0161630 A1 | 7/2005 | Chui et al. | |
| 2005/0185346 A1 | 8/2005 | Shoji | |
| 2005/0195532 A1 | 9/2005 | Sugiyama et al. | |
| 2006/0098354 A1 | 5/2006 | Parkin | |
| 2006/0130193 A1 | 6/2006 | Roy | |
| 2006/0158927 A1 | 7/2006 | Johnson | |
| 2006/0186432 A1 | 8/2006 | Osipov et al. | |
| 2006/0221507 A1 | 10/2006 | Sato et al. | |
| 2006/0262458 A1 | 11/2006 | Carey et al. | |
| 2007/0052412 A1 | 3/2007 | Desplats | |
| 2008/0085567 A1 | 4/2008 | Tanaka et al. | |
| 2008/0144232 A1 | 6/2008 | Kaka et al. | |
| 2009/0058562 A1 | 3/2009 | Joodaki | |
| 2009/0141409 A1 | 6/2009 | Santos et al. | |
| 2009/0184706 A1* | 7/2009 | Duric et al. | 324/202 |
| 2010/0289490 A1* | 11/2010 | Fan et al. | 324/260 |

FOREIGN PATENT DOCUMENTS

| | | |
|---|---|---|
| JP | 10033497 A | 2/1998 |
| JP | 2007508534 A | 4/2007 |
| KR | 1020090077607 A | 7/2009 |
| WO | WO 0223638 A2 | 3/2002 |
| WO | 2004028002 | 4/2004 |

OTHER PUBLICATIONS

N. Mecking et al., "Microwave Photovoltage and Photoresistance Effects in Ferromagnetic Microstrips," Physical Review B., vol. 76, 2007.

International Search Report and Written Opinion issued in PCT/US2011/025410, filed Feb. 18, 2011, mailed Oct. 26, 2011.

International Search Report for PCT International Patent Application No. PCT/US2009/032945 mailed Apr. 2, 2009.

Heinrich et al., "Intrinsic Spin Relaxation Processes in Metallic Magnetic Multilayers," Journal of Superconductivity and Novel Magnetism, vol. 20, No. 2, Feb. 2007, pp. 83-89.

Kiselev et al., "Microwave oscillations of a nanomagnet driven by a spin-polarized current," Nature, vol. 425, Sep. 2003, pp. 380-383.

Costache et al., "Electrical Detection of Spin Pumping due to the Processing Magnetization of a Single Ferromagnet," Physical Review Letters 97, 216603 (2006).

Grollier et al., "Synchronization of spin-transfer oscillators driven by stimulated microwave currents," Physical Review B 73, 060409® (2006).

Tserkovnyak et al., "Nonfocal magnetization dynamics in ferromagnetic heterostructures,"Reviews of Modern Physics, vol. 77, Oct. 2005, pp. 1375-1421.

Wang et al., "Voltage Generation by Ferromagnetic Resonance at a Nonmagnet to Ferromagnet Contact," Physical Review Letters 97, 216602 (2006).

Brataas et al., "Spin battery operated by ferromagnetic resonance," Physical Review B 66, 060404® (2002).

Mizukami et al., "Ferromagnetic resonance linewidth for NM/80NiFe/NM films (NM=Cu, Ta, Pd and Pt)," Journal of Magnetism and Magnetic Materials 226-230 (2001), pp. 1640-1642.

Heinrich et al., "Dynamic Exchange Coupling in Magnetic Bilayers," Physical Review Letters, vol. 90, No. 18 (2003).

Gerrits et al., "Enhanced ferromagnetic damping in Permalloy/Cu bilayers," Journal of Applied Physics 99, 023901 (2006).

Cywinski, "Proposal of a spintronics-based polarization detector," 2005, pp. 8-9.

* cited by examiner

100

100

ELECTROMAGNETIC WAVE DETECTION SYSTEMS AND METHODS

CROSS REFERENCE TO RELATED APPLICATIONS

This application claims priority to U.S. patent application No. 61/305,729, entitled "MICROWAVE DEVICES BASED ON METAMATERIALS AND SPINTRONIC DEVICES," filed on Feb. 18, 2010, and this application is a continuation-in-part of U.S. patent application Ser. No. 12/779,391, entitled "ELECTROMAGNETIC DETECTION APPARATUS AND METHODS," filed on May 13, 2010, which claims priority to U.S. patent application No. 61/178,212, entitled "ELECTROMAGNETIC DETECTION APPARATUS AND METHODS," filed on May 14, 2009. The contents of each of the above applications are incorporated herein by reference in their entirety.

FIELD OF THE INVENTION

The present invention relates generally to electromagnetic wave detection systems and methods, and more particularly, to electromagnetic wave detection systems and methods that utilize inductive and/or spintronic components.

BACKGROUND OF THE INVENTION

Electromagnetic wave detectors are used to detect electromagnetic waves. Conventional detectors make direct use of the electric field portion of the electromagnetic wave for detection. Conventional detectors, however, may have difficulty detecting high power electromagnetic waves and may be bulky.

SUMMARY OF THE INVENTION

The present invention is embodied in systems and methods for detecting electromagnetic waves.

In accordance with one aspect of the present invention, a system for use in detecting an electromagnetic wave is disclosed. The system comprises an inductive device and a spintronic device. The inductive device generates an induced electromagnetic field when the inductive device receives the electromagnetic wave. The spintronic device is positioned adjacent the inductive device. The spintronic device has an impedance that changes when exposed to the induced electromagnetic field from the inductive device. The change in impedance is indicative of the electromagnetic wave received by the inductive device.

In accordance with another aspect of the present invention, a system for use in detecting or transmitting an electromagnetic wave is disclosed. The system comprises a conductive device and an inductive device. The conductive device comprises a conductive inner wire and a conductive outer cylinder coaxial with the conductive inner wire. The conductive inner wire and conductive outer cylinder define a waveguide. The conductive device further comprises a conductive connector connecting an end of the conductive inner wire with a corresponding end of the conductive outer cylinder. The inductive device is positioned adjacent the conductive connector. The inductive device is configured to generate an induced electromagnetic wave when the inductive device receives the electromagnetic wave.

In accordance with still another aspect of the present invention, a system for detecting electromagnetic wave permittivity or permeability of an object is disclosed. The system comprises a pair of antennas and an inductive device. One of the pair of antennas is configured to transmit an electromagnetic wave. The other of the pair of antennas is configured to receive the transmitted electromagnetic wave. The inductive device is positioned between the pair of antennas. The inductive device is configured to absorb the electromagnetic wave transmitted by the one of the pair of antennas. The absorption is indicative of the electromagnetic wave permittivity or permeability of the object.

In accordance with another aspect of the present invention, a method for detecting an electromagnetic wave is disclosed. The method comprises the steps of receiving the electromagnetic wave with an inductive device, generating an induced electromagnetic field with the inductive device, the induced electromagnetic field corresponding to the received electromagnetic wave, exposing a spintronic device to the induced electromagnetic field from the inductive device, and detecting a change in an impedance of the spintronic device caused by the induced electromagnetic field, the change in the impedance indicative of the electromagnetic wave received by the inductive device.

In accordance with yet another aspect of the present invention, a method for detecting an electromagnetic wave is disclosed. The method comprises the steps of receiving the electromagnetic wave with an inductive device, generating an induced electromagnetic wave with the inductive device, and passing the induced electromagnetic wave for detection along a waveguide defined by a conductive device.

In accordance with another aspect of the present invention, a method for transmitting an electromagnetic wave is disclosed. The method comprises the steps of passing an electromagnetic wave along a waveguide defined by a conductive device, absorbing the passed electromagnetic wave with an inductive device, and generating an induced electromagnetic field for transmission with the inductive device, the induced electromagnetic field corresponding to the absorbed electromagnetic wave.

In accordance with still another aspect of the present invention, a method for detecting electromagnetic wave permittivity or permeability of an object is disclosed. The method comprises the steps of positioning the object adjacent an inductive device, detecting a change in a resonant frequency of the inductive device, and determining the electromagnetic wave permittivity or permeability of the object based on the change in the resonant frequency of the inductive device.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures.

DETAILED DESCRIPTION OF THE INVENTION

Figure 1A:
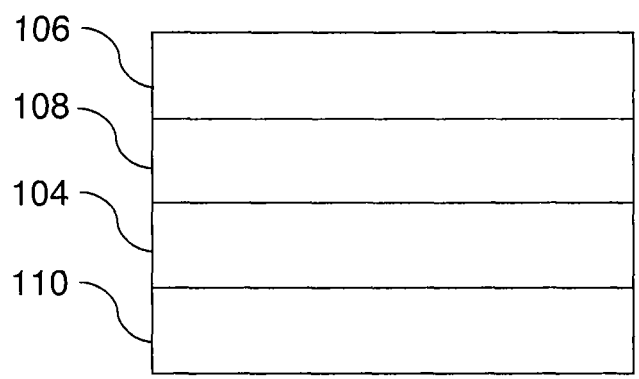
FIG. 1A is a block diagram depicting an exemplary spintronic device for use in describing systems and methods for detecting an electromagnetic wave in accordance with aspects of the present invention.

The exemplary systems and methods disclosed herein are broadly usable for detecting electromagnetic waves. The disclosed systems and methods may be particularly suitable for detecting electromagnetic waves in the radio-wave and microwave regions. The disclosed systems and methods may utilize inductive and spintronic components to achieve improved electromagnetic wave detection. A brief explanation of the spintronic and inductive components is provided herein.

Electrons have both charge and spin properties. The field of electronics is based on the charge property of electrons. The field of spintronics is based on the spin property of electrons. Spintronics generally concerns the detection and/or manipulation of electron spin within a device, which can influence the charge properties of the device. Electron spin is a vector quantity with its direction defined as the direction of magnetization of the electron. There are generally two categories of spin, spin-up and spin-down. Consequently, electrons may be grouped into spin-up and spin-down electrons. Charges or currents having any arbitrary spin direction can be constructed from the combination of these two bases.

In magnetic materials, one type of electron spin may be more common than the other, in which case they are defined as majority and minority spins. In such materials, an electrical current through the material can be thought of as consisting of two parallel channels corresponding to a flow of majority spin and minority spin electrons. When the number of electrons in each channel is different, the overall current carries a net spin direction, termed as spin-polarized current. Additionally, the electrical impedance in the majority spin channel and the minority spin channel may be different. Similarly, these impedances combine to create a separate overall impedance, termed a spin-dependent impedance.

As magnetic materials are configured in a multilayer system, the electrical transport properties of the system will depend on the magnetization direction of each magnetic layer. The electrical transport properties of a material or system may include, for example, the electrical current through the system, the impedance of the system, or the voltage across the system. These electrical transport properties may vary depending on the spin of the electrons passing through the magnetic layers, and can therefore also be understood as spin-polarized transport properties. It will be understood that any reference herein to the electrical properties of a device such as current, impedance, or voltage will be referencing the spin-polarized transport properties of the respective material or device, which are dependent on the magnetic properties of the material or device.

As used herein, the term "impedance" refers to the dominant affect, change in impedance and/or resistance, presented by the device. In an exemplary embodiment, where the dominant affect presented by the device is a change in impedance, impedance will be determined, and where the dominant affect presented by the device is resistance, resistance will be determined.

Aspects of the invention will now be described with reference to the accompanying figures. FIG. 1A illustrates a spintronic device 100 for use in describing exemplary systems and methods for detecting an electromagnetic wave in accordance with aspects of the present invention. The electromagnetic wave may optimally be in the microwave or radio-wave range; however, it is contemplated that spintronic device 100 may be usable to detect electromagnetic radiation outside of the microwave or radio-wave range. As a general overview, spintronic device 100 includes two magnetic layers 104 and 106 and a barrier layer 108. Spintronic device 100 may also include a fixing layer 110. Additional details of spintronic device 100 are provided below.

Magnetic layers 104 and 106 are layers of magnetic material. In an exemplary embodiment, magnetic layers 104 and 106 are formed from ferromagnetic material. However, it is contemplated that magnetic layers 104 and 106 may be formed from other magnetic materials including, for example, ferrimagnetic materials, antiferromagnetic materials, or a combination of magnetic materials. Suitable magnetic materials for magnetic layers 104 and 106 may include, for example, at least one of the elements Ni, Fe, Mn, Co, or their alloys, or half-metallic ferromagnets such as NiMnSb, PtMnSb, $Fe_3O_4$, or $CrO_2$. Other suitable magnetic materials for magnetic layers 104 and 106 will be understood by one of ordinary skill in the art from the description herein.

Barrier layer 108 is positioned between magnetic layers 104 and 106. In an exemplary embodiment, barrier layer 108 is formed from an insulating material such as, for example, an oxide or nitride of one or more of Al, Mg, Si, Hf, Sr, Zn, Zr, or Ti. In another exemplary embodiment, barrier layer 108 may be formed from conducting materials. Such conducting materials may allow electrons to easily pass from one magnetic layer to the other. Suitable conducting materials for barrier layer 108 will be understood by one of ordinary skill in the art from the description herein.

Fixing layer 110 may be positioned adjacent magnetic layer 104. In an exemplary embodiment, fixing layer 110 fixes the magnetization direction of magnetic layer 104. Fixing layer 110 may consist of a single layer of material or may consist of a stack of layers of one or more materials, as would be know to one of ordinary skill in the art. Fixing layer 110 may optimally be formed from antiferromagnetic or ferromagnetic materials such as, for example, FeMn, NiMn, FeNiMn, FeMnRh, RhMn, CoMn, CrMn, CrMnPt, CrMnRh, CrMnCu, CrMnPd, CrMnIr, CrMnNi, CrMnCo, CrMnTi, PtMn, PdMn, PdPtMn, IrMn, NiO, CoO, SmCo, NdFeB, FePt, or a combination of these materials, which fix the magnetization direction of magnetic layer 104. Other suitable materials for fixing layer 110 will be understood by one of ordinary skill in the art from the description herein.

Spintronic device 100 has an associated impedance dependent on layers 104-110 of spintronic device 100. In an exemplary embodiment, the impedance of spintronic device 100 is dependent on the magnetization directions of magnetic layers 104 and 106. Magnetic layers 104 and 106 each have an associated magnetization direction (depicted by arrows in FIGS. 1B-1C). In an exemplary embodiment, the magnetization direction of magnetic layer 104 is fixed in a single direction and the magnetization direction of magnetic layer 106 is unfixed, or free.

Figure 1B:
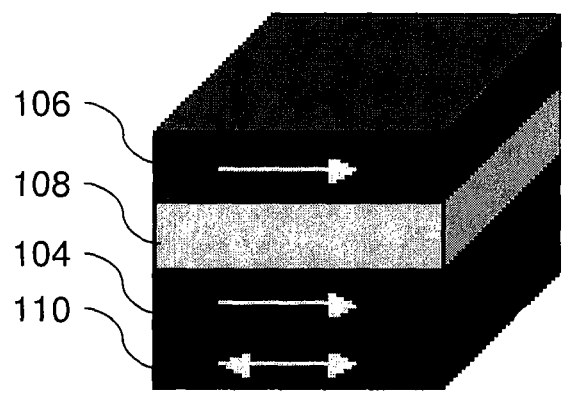
FIGS. 1B and 1C are perspective diagrams depicting exemplary embodiments of the device of FIG. 1A.
Figure 1C:
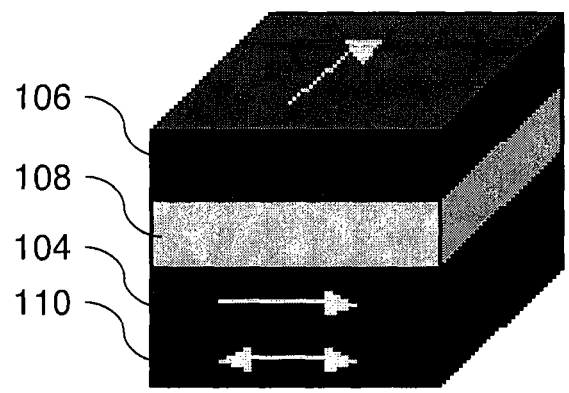

The magnetization direction of magnetic layer 104 may be fixed by positioning fixing layer 110 adjacent magnetic layer 104. The unfixed magnetization direction of magnetic layer 106 may be configured to initially have a given direction relative to the fixed magnetization direction of magnetic layer 104. For example, the initial magnetization direction of magnetic layer 106 may be parallel to the magnetization direction of magnetic layer 104, as depicted in FIG. 1B. Alternatively, the initial magnetization of magnetic layer 106 may be perpendicular to the magnetization direction of magnetic layer 104, as depicted in FIG. 1C. In either configuration, however, the unfixed magnetization direction of magnetic layer 106 may be free to rotate away from the initially configured direction, e.g., through a full 360°. The initial magnetization direction of magnetic layer 106 may be selected by applying an external DC magnetic field to spintronic device 100 in the desired direction of the unfixed magnetization. The external DC magnetic field may be generated by an external electromagnet or by a DC current adjacent spintronic device 100.

Figure 1D:
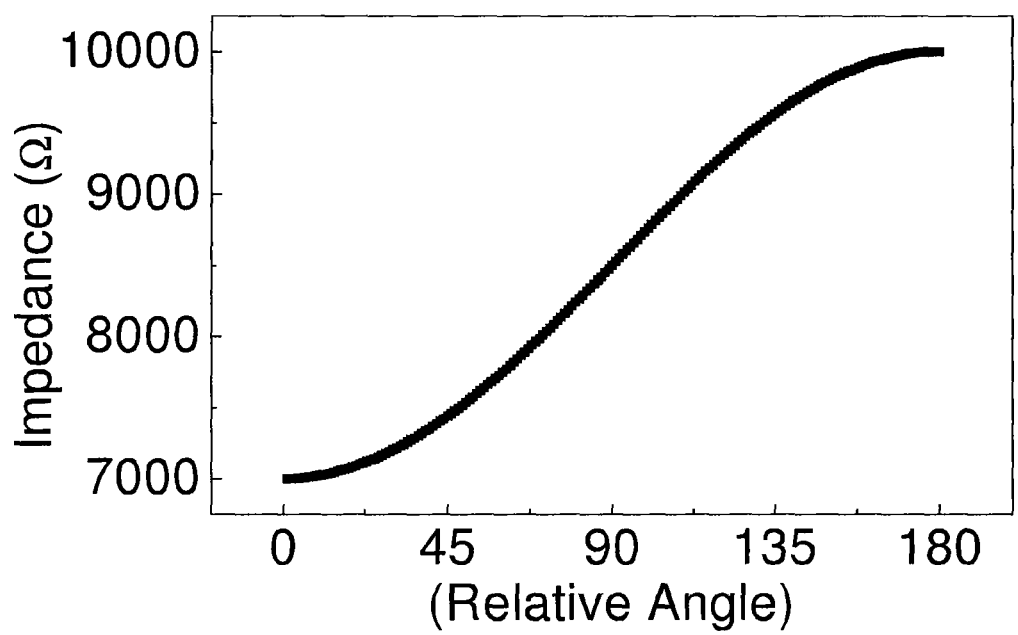
FIG. 1D is a graph depicting the magnitude of the impedance of the device of FIG. 1A.

The impedance of spintronic device 100 is dependent on a relative angle between the magnetization directions of magnetic layers 104 and 106. FIG. 1D depicts a graph of impedance of exemplary spintronic device 100 based on the relative angle between the magnetization directions of magnetic layers 104 and 106. In an exemplary embodiment, the magnitude of impedance of spintronic device 100 is lowest when the relative angle between the fixed magnetization direction and the unfixed magnetization direction is 0°, i.e., when the directions are parallel. The magnitude of impedance of spintronic device 100 is highest when the relative angle between the fixed magnetization and the unfixed magnetization is 180°, i.e., when the directions are antiparallel, or opposite. In a free electron model, the impedance of spintronic device 100 may be shown by:

$$R = \frac{R_P + R_{AP}}{2} - \frac{(R_{AP} - R_P)}{2}\cos\theta$$

where $R_P$ and $R_{AP}$ are resistances when the two magnetic layers 104 and 106 are in parallel and antiparallel configurations, respectively, and where $\theta$ is the relative angle between moments of the two magnetic layers 104 and 106.

The magnetization direction of magnetic layer 106 is at least partially dependent on a magnetic field received by spintronic device 100. Accordingly, as will be discussed in greater detail below, exposure of magnetic layer 106 to an electromagnetic wave, which will have electric and magnetic field portions, may cause the magnetization direction of magnetic layer 106 to change. A change in the unfixed magnetization direction of magnetic layer 106 causes a change in the relative angle, which in turn changes the impedance of spintronic device 100. Accordingly, the impedance of spintronic device 100 may change when exposed to a magnetic field, and therefore is at least partially dependent on exposure to an electromagnetic wave.

Free magnetic layer 106 is also sensitive to magnetic field due to ferromagnetic resonance (FMR). When magnetic layer 106 is exposed to an electromagnetic wave, the magnetic moment of magnetic layer 106 precesses, and forms a time dependent angle with fixed layer. The larger the amplitude of the electromagnetic wave and/or the closer the frequency of the electromagnetic wave to the FMR of magnetic layer 106, the larger the amplitude of the precession. This will induce a time-dependent resistance in the presence of an electromagnetic wave, which may be shown by:

$$\theta(t) = \sin^{-1}\frac{Re[\chi h_{rf} e^{i\omega t}]}{M_s},$$

where $$\chi = \frac{\gamma M_s[\gamma(H_{bias} + H_a + M_s) + i\alpha f]}{\begin{bmatrix}(\gamma(H_{bias} + H_a + M_s) + i\alpha f)\\(\gamma(H_{bias} + H_a) + i\alpha f) - f^2\end{bmatrix}}$$

where $H_{bias}$ is an external DC magnetic field, $M_s$ and $H_a$ are the saturation magnetization and uniaxial anisotropy of the free magnetic layer, respectively, $\chi$ is the magnetic susceptibility of the free magnetic layer, $h_{rf}$ is the magnetic field of the electromagnetic wave, f is the frequency of the electromagnetic wave, $\gamma$ is the gyromagnetic ratio of 28 GHz/Tesla, and $\alpha$ is the damping constant of the free magnetic layer.

Although spintronic device 100 illustrates layers 104-110 having the same width, it is contemplated that any of the layers of spintronic device 100 could be wider or narrower as necessary to optimize the impedance and magnetization orientation of spintronic device 100. In a preferred embodiment, spintronic device 100 is a device having a relatively large magnetoimpedance (e.g., greater than 5%), such as, for example, a magnetic tunnel junction or a spin valve. However, spintronic device 100 may be any suitable spintronic device. Suitable spintronic devices 100 for use with the present invention will be understood by one of skill in the art from the description herein.

The interaction between an electromagnetic wave and magnetic layer 106 will now be described. In an exemplary embodiment, the free magnetic layer is sensitive to ferromagnetic resonance. This means that, when exposed to an electromagnetic wave, the unfixed magnetization direction precesses in response to the magnetic field portion of the electromagnetic wave. The free magnetic layer has a specific ferromagnetic resonant frequency at which the unfixed magnetization direction experiences the largest angle of precession. This frequency may be located in the microwave or radio-wave range.

The angle of precession of the unfixed magnetization direction is dependent on the magnetic field portion and the frequency of the electromagnetic wave. For example, as the magnitude of the magnetic field portion of the electromagnetic wave increases, the amplitude of the precession of the magnetization direction increases. For another example, as the frequency of the electromagnetic wave approaches the ferromagnetic resonant frequency of the magnetic layer, the amplitude of the precession of the magnetization direction also increases. In a configuration where the fixed and unfixed magnetic layers are initially configured to a specific relative angle (e.g., parallel or perpendicular), exposure to an electromagnetic wave may cause the relative angle between the fixed and unfixed magnetization directions to precess around the pre-configured angle. Precession of the relative angle thereby causes a change in the impedance of the spintronic device, which can be measured by a suitable voltage detector. This allows an exemplary spintronic device of the present invention to convert a received electromagnetic wave into a voltage signal which can be measured with a detector.

Figure 2A:
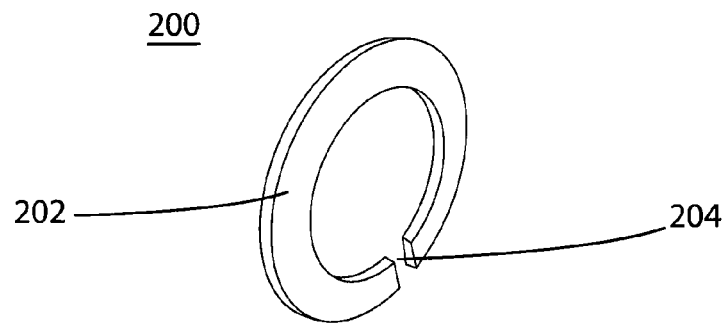
FIGS. 2A-2C are diagrams depicting exemplary inductive devices for use in describing systems and methods for detecting an electromagnetic wave in accordance with aspects of the present invention.
Figures 2B, 2C:
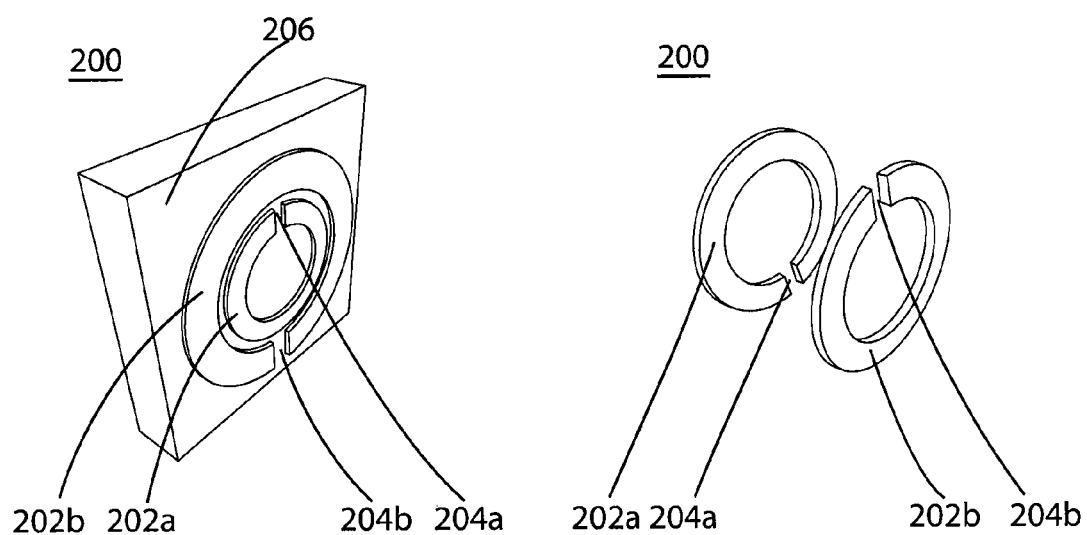

FIGS. 2A-2C illustrate an inductive device 200 for use in describing exemplary systems and methods for detecting an electromagnetic wave in accordance with aspects of the present invention. The electromagnetic wave may optimally be in the microwave or radio-wave range; however, it is contemplated that inductive device 200 may be usable to detect electromagnetic radiation outside of the microwave or radio-wave range. Additional details of inductive device 200 are provided below.

As shown in FIG. 2A, inductive device includes an annulus 202 having a gap 204. Gap 204 forms a complete break in annulus 202. Annulus 202 is made of conductive material. Suitable conductive materials for use as annulus 202 include, for example, Cu, Nb, Ni, Au, Ag, Al, Pt, Cr, Ta, or alloys thereof. Other suitable conductive materials will be known to one of ordinary skill in the art from the description herein.

In the presence of an electromagnetic field, annulus 202 behaves as an inductor. Correspondingly, gap 204 behaves as a capacitor in the presence of an electromagnetic field. As such, inductive device 200 acts as an LC circuit when exposed to an electromagnetic wave. Inductive device 200 has a resonant frequency dependent on the inductance of annulus 202 and the capacitance of gap 204. Accordingly, the resonant frequency may be tuned based on the size of annulus 202 and gap 204.

In an exemplary embodiment, when inductive device 200 is exposed to an electromagnetic wave, a resonating current is induced in annulus 202. The resonating current generates an electromagnetic field near the surface of annulus 202. The frequency of the resonating current is dependent on the frequency of the received electromagnetic wave. Accordingly, the induced electromagnetic field has the same frequency as the electromagnetic wave received by inductive device 200.

The induced electromagnetic field may have a substantially greater amplitude than the amplitude of the received electromagnetic wave (e.g. 1000 times larger). The amplitude of the induced electromagnetic field may vary based on the frequency of the received electromagnetic wave. For example, as the magnitude of the electromagnetic wave increases, the amplitude of the induced electromagnetic field increases. For another example, as the frequency of the electromagnetic wave approaches the resonant frequency of the inductive device 200, the amplitude of the induced electromagnetic field also increases.

It will be understood to one of ordinary skill in the art that inductive device 200 is not limited to the configuration disclosed in FIG. 2A. As shown in FIG. 2B, the annulus of inductive device 200 may comprise a first annulus 202a and a second annulus 202b. Annulus 202a is positioned coaxially within annulus 202b. Annuli 202a and 202b may be formed of the same or different conductive materials. Annuli 202a and 202b each include a respective gap 204a and 204b. Gap 204a is positioned diametrically opposite from gap 204b. Annuli 202a and 202b may be mounted on a substrate 206, as shown in FIG. 2B. Alternatively, annuli 202a and 202b may be axially spaced from each other, as shown in FIG. 2C. Each of annuli 202a and 202b may be mounted to the same substrate (as illustrated) or to separate substrates (not shown). Additional configurations for inductive device 200 will be known to one of ordinary skill in the art from the description herein.

Additionally, while inductive device 200 is described as comprising an annulus, it will be understood to one of ordinary skill in the art that the shape of inductive device 200 is not so limited. Inductive device 200 may comprise a length of conductive material forming any shape such as, for example, an ellipse, triangle, quadrangle, etc. Inductive device 200 may be any suitable metamaterial that possesses an electromagnetic resonant property, i.e., that resonates in the presence of an electromagnetic field. Suitable metamaterials for use as inductive device 200 include, for example, split-ring resonators. Other suitable metamaterials will be known to one of ordinary skill in the art from the description herein.

Figure 3A:
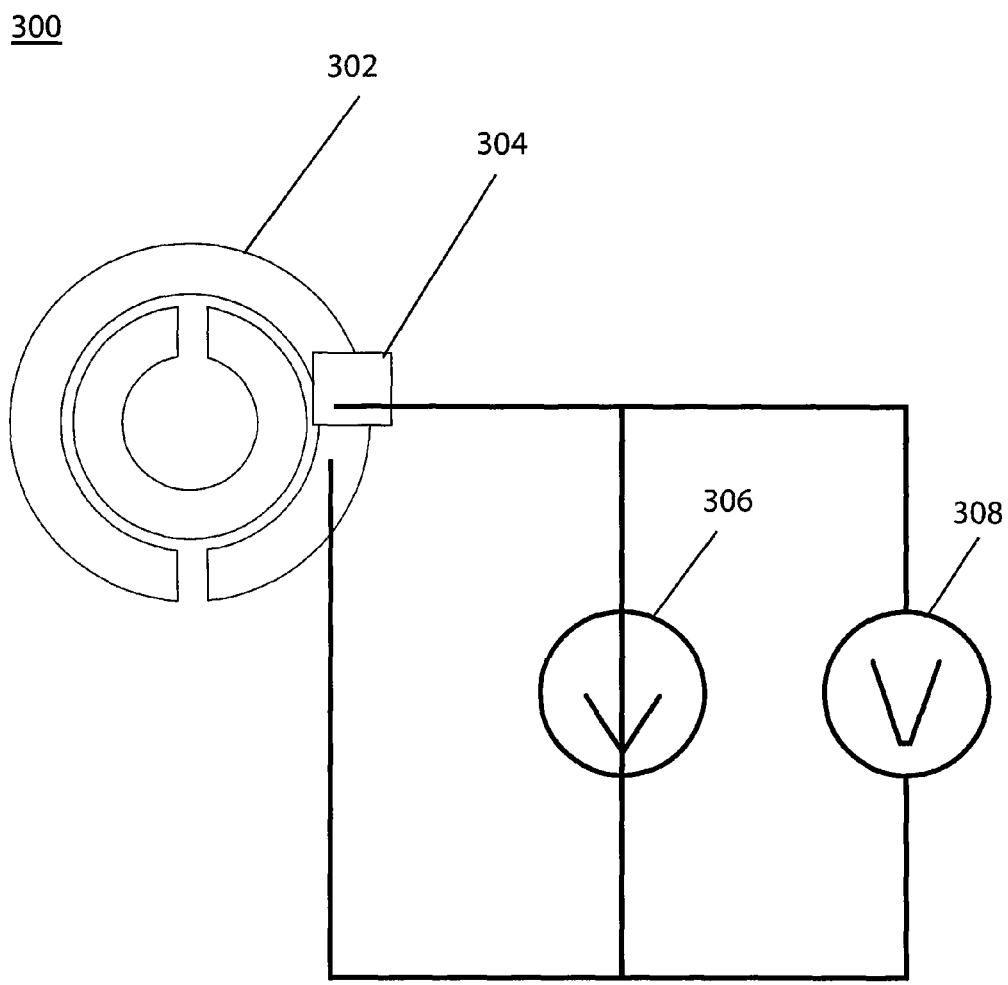
FIGS. 3A-3C are diagrams depicting exemplary systems for detecting an electromagnetic wave in accordance with aspects of the present invention.

FIG. 3A is a diagram illustrating an exemplary system 300 for use in detecting an electromagnetic wave in accordance with aspects of the present invention. The electromagnetic wave may optimally be in the microwave or radio-wave range; however, it is contemplated that system 300 may be usable to detect electromagnetic radiation outside of the microwave or radio-wave range. As a general overview, system 300 includes an inductive device 302 and a spintronic device 304. Inductive device 302 may be an inductive device substantially as described above with respect to inductive device 200. Spintronic device 304 may be an spintronic device substantially as described above with respect to spintronic device 100. Additional details of system 300 are provided below.

Inductive device 302 receives the electromagnetic wave to be detected. Inductive device 302 is configured to generate an induced electromagnetic field response to receiving the electromagnetic wave, as described above. Inductive device 302 generates the induced electromagnetic field locally, i.e., near the surface of the annulus of inductive device 302.

Spintronic device 304 is positioned adjacent the surface of inductive device 302. For example, spintronic device 304 may be mounted directly on the top surface of the annulus of inductive device 302. Alternatively, spintronic device 304 may be mounted near the surface of inductive device 302, e.g., less than about 100 micrometers. Where inductive device 302 includes an inner and outer annulus, as shown in FIG. 2B, spintronic device 304 may desirably be positioned adjacent a surface of the outer annulus. Accordingly, spintronic device 304 is exposed to the induced electromagnetic field generated by inductive device 302. As set forth above, spintronic device 304 has an impedance dependent on a relative angle between the fixed magnetization direction and the unfixed magnetization direction of its magnetic layers. Exposure of spintronic device 304 to the induced electromagnetic field from inductive device 302 causes a change in this relative angle, which causes a change in the impedance of spintronic device 304.

The positioning of spintronic device 304 relative to inductive device 302 may depend on how the relative angle between the fixed and unfixed magnetic layers of spintronic device 304 is initially configured. In one preferred embodiment, the relative angle between the fixed magnetization direction and the unfixed magnetization direction is initially configured to be approximately 90°. In this embodiment, the spintronic device 304 is desirably positioned adjacent a point on the inductive device 302 at which a product of the induced magnetic field and the induced electric field is at a maximum. The determination of such a point on inductive device 302 will be understood to one of ordinary skill in the art from the description herein.

In another preferred embodiment, the relative angle between the fixed magnetization direction and the unfixed magnetization direction is initially configured to be one of approximately 0° and approximately 180°. In this embodiment, system 300 may further include a power source 306 configured to supply a current through spintronic device 304. Power source 306 may be desirable in this embodiment in order to measure a change in average impedance of spintronic device 304 caused by the precession of the magnetization direction. In this embodiment, the spintronic device 304 is desirably positioned adjacent a point on the inductive device 302 at which the induced magnetic field is at a maximum. Again, the determination of such a point on inductive device 302 will be understood to one of ordinary skill in the art from the description herein.

It may be desirable that both inductive device 302 and spintronic device 304 have the same resonant frequency to achieve maximum sensitivity for system 300. As set forth above, the resonant frequency of inductive device 302 may be tuned, for example, by changing the size of the gap in the conductive annulus. This may be achieved by replacing the gap with a tunable capacitor to adjust the capacitance of inductive device 302. The resonant frequency of spintronic device may be tuned, for example, by applying an external DC magnetic field to spintronic device 304 via an external magnetic field source (not shown). An external DC magnetic field may be applied from an electromagnetic or current adjacent spintronic device 304 (not shown). Applying an external DC magnetic field to spintronic device 304 may change the resonant frequency of the unfixed magnetic layer as shown by:

$$f = \gamma \sqrt{(H_{dc} + H_{an})(H_{dc} + H_{an} + M_s)}$$

where $\gamma$ is the gyromagnetic ratio, $H_{dc}$ is the applied DC magnetic field, $H_{an}$ is the anisotropy field, and $M_s$ is the saturation magnetization. The values of $\gamma$, $H_{an}$ and $M_s$ all depend on the magnetic material used in the unfixed magnetic layer and may be predetermined. Therefore, the applied DC magnetic field, $H_{dc}$, may be swept to tune the ferromagnetic resonant frequency of spintronic device 304 as desired.

System 300 may also include a detector 308. Detector 308 measures the voltage across spintronic device 304. In an exemplary embodiment, detector 308 is a voltage detector such as, for example, a lock-in amplifier. However, detector 308 may be any suitable voltage detector. The voltage measured by detector 308 is dependent on the impedance of spintronic device 304. As described above, exposure to the induced electromagnetic field may change the impedance of spintronic device 304. Accordingly, system 300 may detect an electromagnetic wave based on a change in the impedance of spintronic device 304, which is reflected in a change in the voltage measured by detector 308. A suitable voltage detector will be known to one of ordinary skill in the art from the description herein.

As set forth above, the change in the relative angle between the fixed magnetization direction and the unfixed magnetization direction may be influenced by the FMR of the free magnetic layer of spintronic device 304. The frequency of the induced electromagnetic field corresponds to the frequency of the electromagnetic wave received by inductive device 302. As the frequency of the induced electromagnetic field approaches the ferromagnetic resonant frequency of the free magnetic layer, the amplitude of the precession of the magnetization direction increases. Thus, the magnitude of the change in impedance of spintronic device 304 may be indicative of the frequency of the electromagnetic wave received by inductive device 302. The frequency of the electromagnetic wave may thereby be determined based on the known FMR of spintronic device 304 and the magnitude of the observed change in impedance of spintronic device 304.

Further, the frequency of the electromagnetic wave may be determined using an external magnetic field source. To determine the frequency of the electromagnetic wave, one may sweep the magnitude of the external DC magnetic field and observe the magnetic field that produces the largest voltage change measured by detector 308, which corresponds to the largest impedance change of spintronic device 304. The frequency of the electromagnetic wave received by inductive device 302 may then be determined using value of the external DC magnetic field at which the largest impedance change occurs.

Figure 3B:
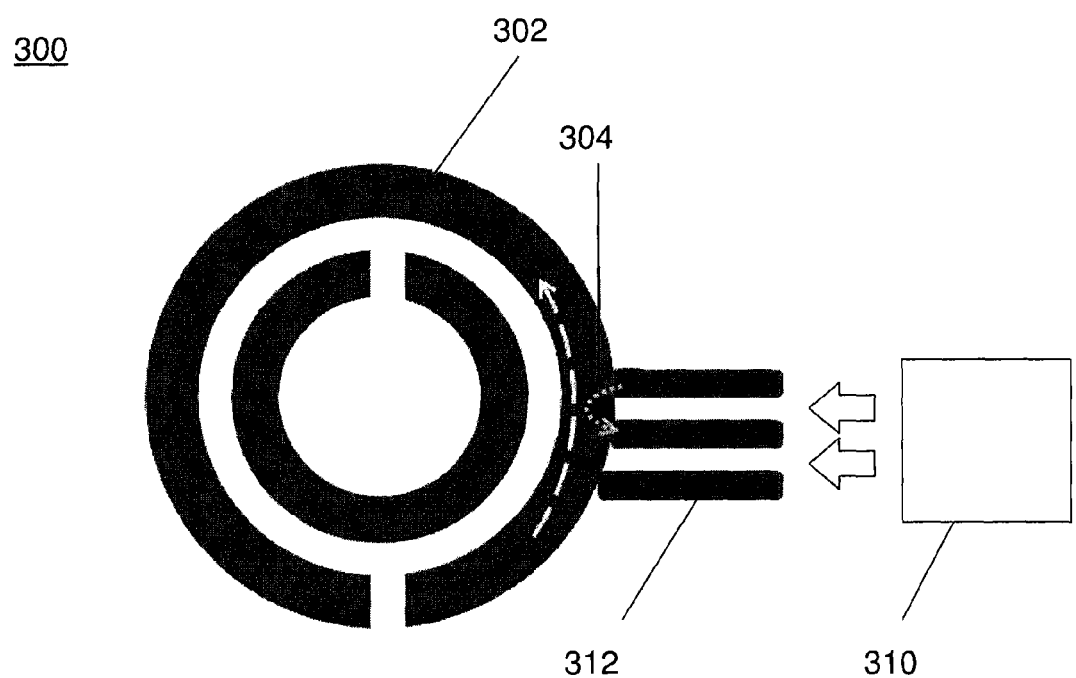

System 300 may further include a reference electromagnetic wave source 310, as shown in FIG. 3B. Reference electromagnetic wave source 310 is configured to apply a reference electromagnetic wave to spintronic device 304. In an exemplary embodiment, reference electromagnetic wave source 310 is any frequency-tunable electromagnetic wave source. Reference electromagnetic wave source 310 emits a reference electromagnetic wave tuned to the same frequency as the electromagnetic wave received by inductive device 302. In an alternative embodiment, the reference electromagnetic wave source may generate the reference electromagnetic wave by splitting the received electromagnetic wave, e.g. as in conventional vector network analyzers. A suitable reference electromagnetic wave source will be understood by one of skill in the art from the description herein.

Reference electromagnetic wave source 310 desirably includes a phase tuner (not shown). The phase tuner adjusts the phase of the reference electromagnetic wave from source 310. In an exemplary embodiment, the phase tuner receives the reference electromagnetic wave from source 310, adjusts the phase of the reference electromagnetic wave, and transmits the wave to spintronic device 304 via a receiver 312. The receiver may be, for example, a coplanar waveguide. A suitable phase tuner and receiver will be understood by one of skill in the art from the description herein.

System 300 may detect the frequency of the received electromagnetic wave as described above. Additionally, system 300 may detect a phase of the received electromagnetic wave using reference electromagnetic wave source 310. In an exemplary embodiment, system 300 determines the frequency of a received electromagnetic wave as set forth above. Reference electromagnetic wave source 310 is then tuned to emit a reference electromagnetic wave having the same frequency as the received wave. The phase tuner sweeps the phase of the reference electromagnetic wave from 0° to 360°, and receiver 312 transmits the reference electromagnetic wave to spintronic device 304.

The detector 308 of system 300 measures the voltage across spintronic device 304 as the phase of the reference electromagnetic wave is swept. As the phase of the reference electromagnetic wave is swept, the reference electromagnetic wave will generate interference with the change in impedance of spintronic device 304 caused by the induced electromagnetic field from inductive device 302. This interference may be used to determine the phase of the induced electromagnetic field, which corresponds to the phase of the received electromagnetic wave. Where the phase of the induced electromagnetic field and the reference electromagnetic wave are the same, the measured voltage reaches a maximum value. Accordingly, system 300 may determine the phase of the electromagnetic wave received by inductive device 302 by noting the phase of the reference electromagnetic wave at the point during the phase sweep where a voltage peak is detected.

While only one spintronic device 304 is illustrated in FIGS. 3A and 3B, it will be understood by one of ordinary skill in the art from the description herein that the invention is not so limited. System 300 may comprise a plurality of spintronic devices 304 positioned adjacent the surface of inductive device 302 in order to enhance the detection sensitivity of system 300. Spintronic devices 304 may be connected with each other in series. Additionally, it may be desirable to position the spintronic devices 304 adjacent to respective points of inductive device 302 at which the induced electromagnetic field differs in amplitude. In this way, different spintronic devices 304 may be usable to detect different power ranges of electromagnetic waves.

Figure 3C:
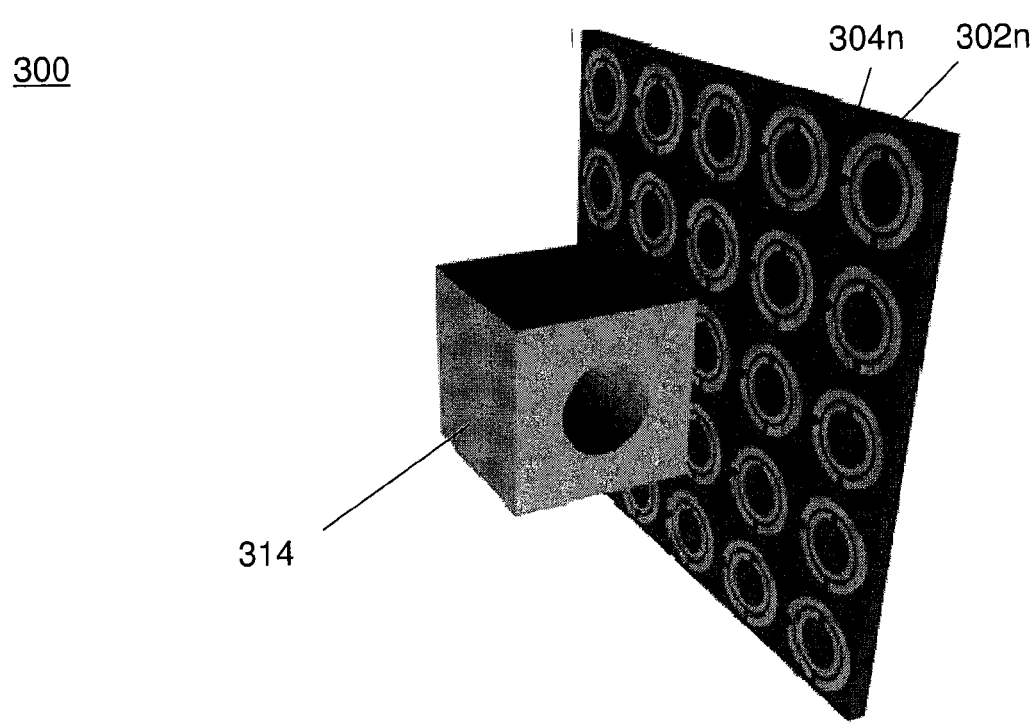

Additionally, as shown in FIG. 3C, system 300 may include a plurality of inductive devices 302 arranged in an array, each inductive device 302n including an associated spintronic device 304n. Such an array of inductive devices 302 and spintronic devices 304 may be particularly suitable for use as an electromagnetic wave imaging system or a non-destructive electromagnetic wave detection system. In the array, each inductive device/spintronic device pair may function as a pixel that detects magnitude, frequency, or phase information of the received electromagnetic wave at the position where the pair is located. In this way system 300 may obtain an electromagnetic wave image of an object to be imaged 314.

Figure 4A:
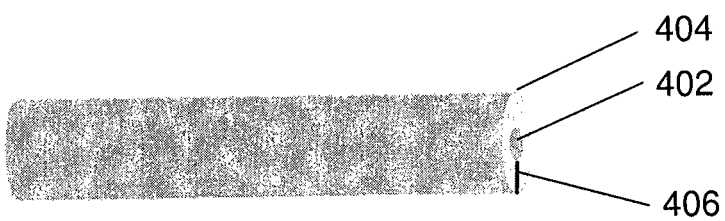
FIGS. 4A and 4B are diagrams depicting exemplary conductive devices for use in describing systems and methods for detecting an electromagnetic wave in accordance with aspects of the present invention.
Figure 4B:
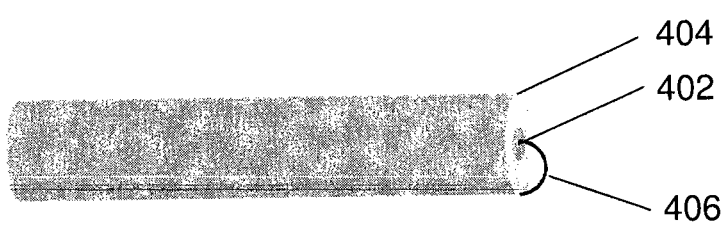

FIGS. 4A and 4B illustrate a conductive device 400 for use in describing exemplary systems and methods for detecting an electromagnetic wave in accordance with aspects of the present invention. The electromagnetic wave may optimally be in the microwave or radio-wave range; however, it is contemplated that conductive device 400 may be usable to detect electromagnetic radiation outside of the microwave or radio-wave range. Additional details of conductive device 400 are provided below.

As shown in FIG. 4A, conductive device 400 includes a conductive inner wire 402 and a conductive outer cylinder 404. Conductive outer cylinder 404 is coaxial with conductive inner wire 402. Together, conductive inner wire 402 and conductive outer cylinder 404 define a waveguide extending along a length of conductive device 400. Both conductive inner wire 402 and conductive outer cylinder 404 are formed from conductive material. Suitable conductive materials for use as conductive inner wire 402 and conductive outer cylinder 404 include, for example, Cu, Nb, Ni, Au, Ag, Al, Pt, Cr, Ta, or alloys thereof. Other suitable conductive materials will be known to one of ordinary skill in the art from the description herein.

Conductive device 400 further includes a conductive connector 406. Conductive connector 406 connects an end of conductive inner wire 402 with a corresponding end of conductive outer cylinder 404. Conductive connector 406 may be formed from the same or different conductive materials as conductive inner wire 402 and/or conductive outer cylinder 404. In an exemplary embodiment, conductive device 400 may be a shorted coaxial cable. Other suitable devices for use as conductive device 400 will be understood by one of ordinary skill in the art from the description herein.

In the presence of an electromagnetic wave, conductive device 400 behaves as a waveguide. An electromagnetic wave may propagate along conductive device 400 toward the end including conductive connector 406. When the electromagnetic wave reaches the end, it may be reflected at conductive connector 406 due to the impedance mismatch between the inside and outside of conductive connector 400.

As shown in FIG. 4A, conductive connector 406 may be straight conductive line formed in a cross-sectional plane of conductive device 400. However, it will be understood to one of ordinary skill in the art that conductive device 400 is not limited to the configuration disclosed in FIG. 2A. As shown in FIG. 4B, for example, conductive connector 406 may be formed as a curved conducting loop. Even further, conductive connector 406 may comprise a spintronic device as described above with respect to spintronic device 100. Additional configurations for conductive device 400 will be known to one of ordinary skill in the art from the description herein.

Figure 5:
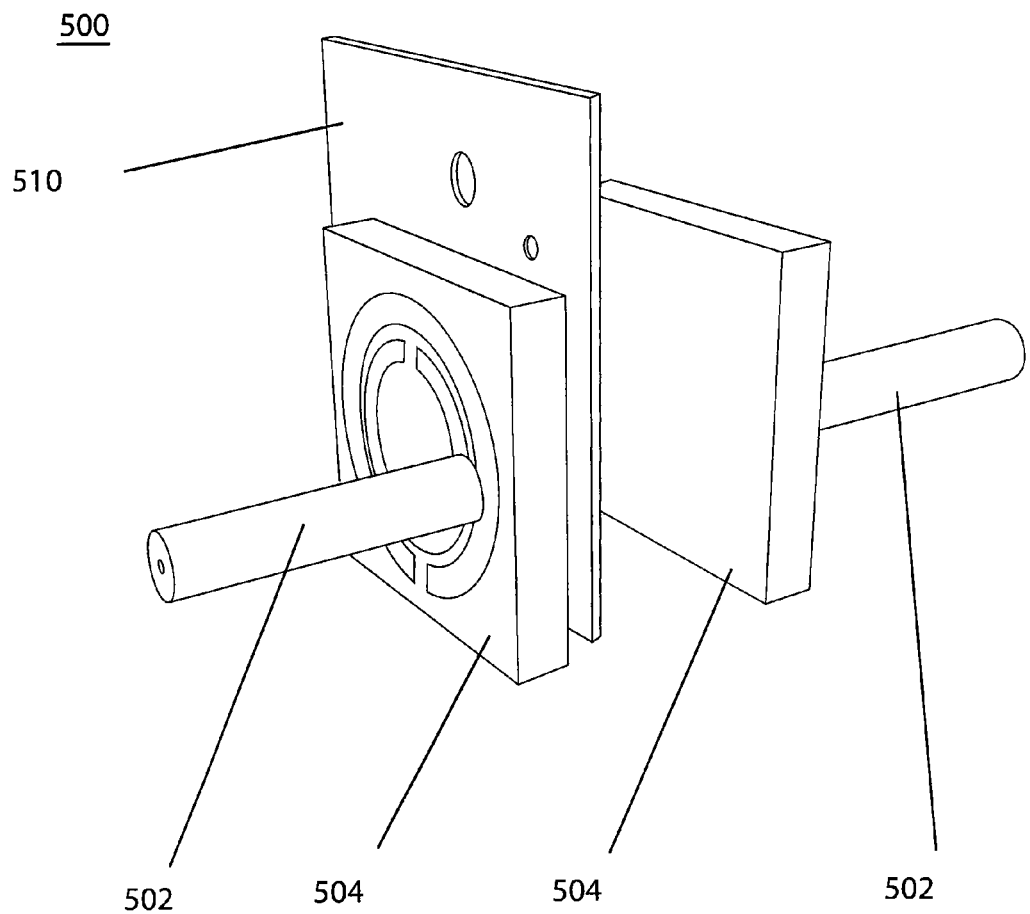
FIG. 5 is a diagram depicting an exemplary system for detecting or transmitting an electromagnetic wave in accordance with aspects of the present invention.

FIG. 5 is a diagram illustrating an exemplary system 500 for use in detecting and/or transmitting an electromagnetic wave in accordance with aspects of the present invention. The electromagnetic wave may optimally be in the microwave or radio-wave range; however, it is contemplated that system 500 may be usable to detect or transmit electromagnetic radiation outside of the microwave or radio-wave range. As a general overview, system 500 includes a conductive device 502 and an inductive device 504. Conductive device 502 may be a conductive device substantially as described above with respect to conductive device 400. Inductive device 504 may be an inductive device substantially as described above with respect to inductive device 200. Additional details of system 500 are provided below.

Inductive device 504 is positioned adjacent the conductive connector of conductive device 502. Inductive device 504 may be positioned such that the annulus of inductive device 504 is positioned in a plane transverse to the axis of conductive device 502.

In one exemplary embodiment, inductive device 504 receives an electromagnetic wave to be detected from free space. Inductive device 504 is configured to generate an induced electromagnetic field response to receiving the electromagnetic wave, as described above. Inductive device 504 generates the induced electromagnetic field locally, i.e., near the surface of the annulus of inductive device 504. Conductive device 502 is positioned to receive the induced electromagnetic wave from inductive device 504 and pass the received electromagnetic wave along the waveguide defined by conductive device 502. Conductive device 502 may then pass the induced electromagnetic wave to separate electrical components (not shown) for detection, processing, and/or analysis. Thus, system 500 may be usable to detect and receive electromagnetic waves from free space.

In another exemplary embodiment, conductive device 502 passes an electromagnetic wave to be transmitted from separate electrical components (not shown). Conductive device 502 passes the electromagnetic wave along the waveguide defined by conductive device 502 toward the conductive connector. As set forth above, when an electromagnetic wave reaches the end of conductive device 502, it may be reflected at the location of the conductive connector. However, when the conductive connector is positioned adjacent inductive device 504, the effective permeability of the conductive device 502 changes. The degree of the change in the effective permeability is dependent on the difference between the frequency of the transmitted electromagnetic wave and the resonant frequency of the inductive device.

As the frequency of the electromagnetic wave passed by the conductive device 502 approaches the resonant frequency of inductive device 504, inductive device 504 absorbs the passed electromagnetic wave. As described above, absorption of the electromagnetic wave induces a resonating current in inductive device 504, which generates an induced electromagnetic wave in the free space surrounding inductive device 504. Thus, system 500 may be usable to transmit electromagnetic waves into free space.

One may determine the amplitude, frequency, or phase of the electromagnetic wave similarly to the methods as described above with respect to system 300. By employing both of the above-described embodiments of system 500 in one or more conductive device/inductive device pairs, system 500 may be usable as an electromagnetic wave antenna, as will be understood to one of ordinary skill in the art from the description herein.

When used for electromagnetic wave imaging, it may be desirable to use two conductive device/inductive device pairs to act as an electromagnetic wave emitter and receiver, as shown in FIG. 5. For example, an object to be imaged 510 may be placed between two such pairs, with the pairs scanned along the area of the object to be imaged. An electromagnetic wave image of the object 510 may then be obtained based on the electromagnetic waves transmitted between the conductive device/inductive device pairs or reflected off of the object to be imaged 510. The transmission and reflection signals may be measured, for example, by a network analyzer. Suitable network analyzers for use with system 500 will be understood to one of ordinary skill in the art from the description herein.

System 500 may also include a barrier having an aperture. In an exemplary embodiment, the barrier is a conductive sheet including a hole for functioning as the aperture. The use of a barrier having an aperture may be desirable to limit the size of the electromagnetic wave generated by inductive device 504. This may generate a relatively focused electromagnetic wave, which may allow for better spatial resolution in the electromagnetic wave imaging system described above.

In addition to electromagnetic wave imaging, system 500 may be usable to detect the electromagnetic wave permittivity and/or permeability of object 510. As set forth above, the resonant frequency of inductive device 504 is dependent at least in part on the effective inductance and capacitance of inductive device 504. It has been determined that the inductance of inductive device 504 depends on the permeability near inductive device 504, while the capacitance of inductive device 504 depends on the permittivity near inductive device 504.

Accordingly, when object 510 approaches system 500, inductive device 504 may experience a shift in resonant frequency or a broadening in resonant frequency line-width. The shift or broadening may be indicative of the permittivity and/or permeability of the object 510. The shift or broadening in the resonant frequency of inductive device 504 may be monitored by transmitting and monitoring the reflection of electromagnetic waves along conductive device 502.

Additionally, in order to achieve broadband permeability or permittivity detection, one may use an inductive device 504 having a tunable capacitors (as described above), or use an array of inductive devices 504 with different resonance frequencies. Further, it may be desirable to insert a spacing material (not shown) with known permittivity/permeability in between the object 510 and the inductive device 504.

Figure 6A:
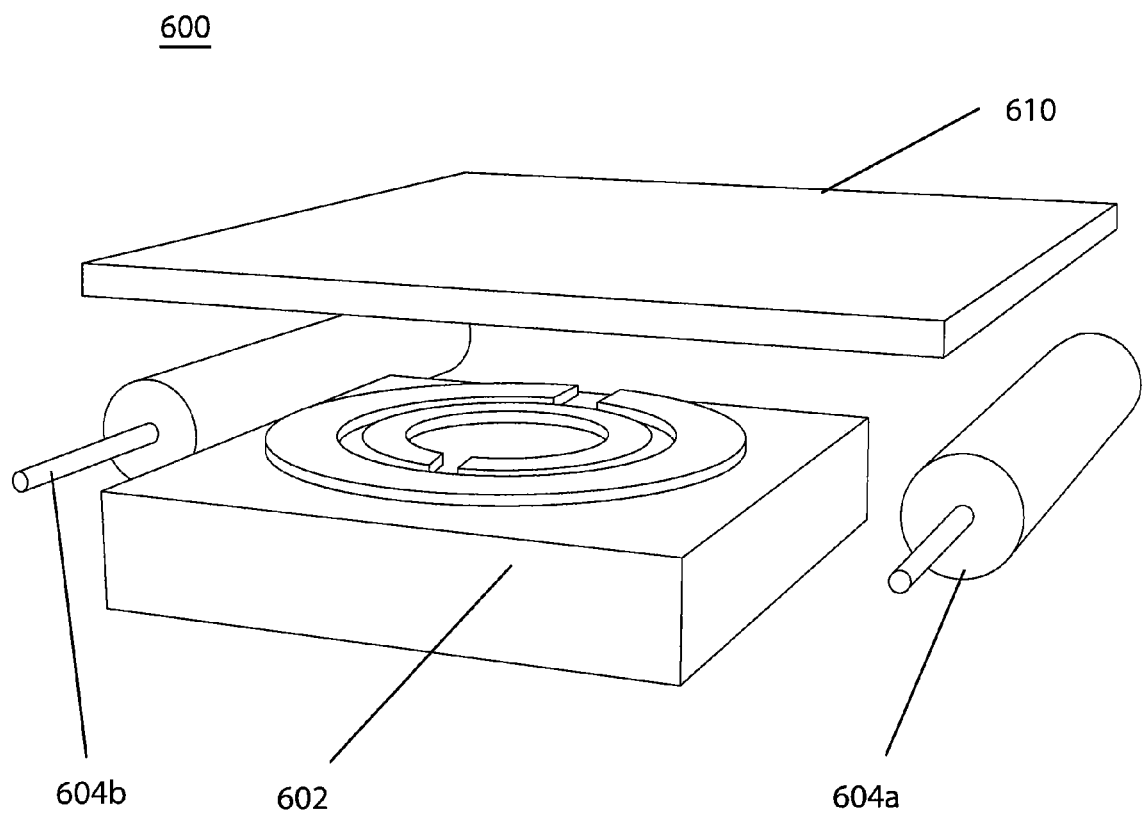
FIGS. 6A and 6B are diagrams depicting exemplary systems for detecting electromagnetic wave permittivity and/or permeability in accordance with aspects of the present invention.
Figure 6B:
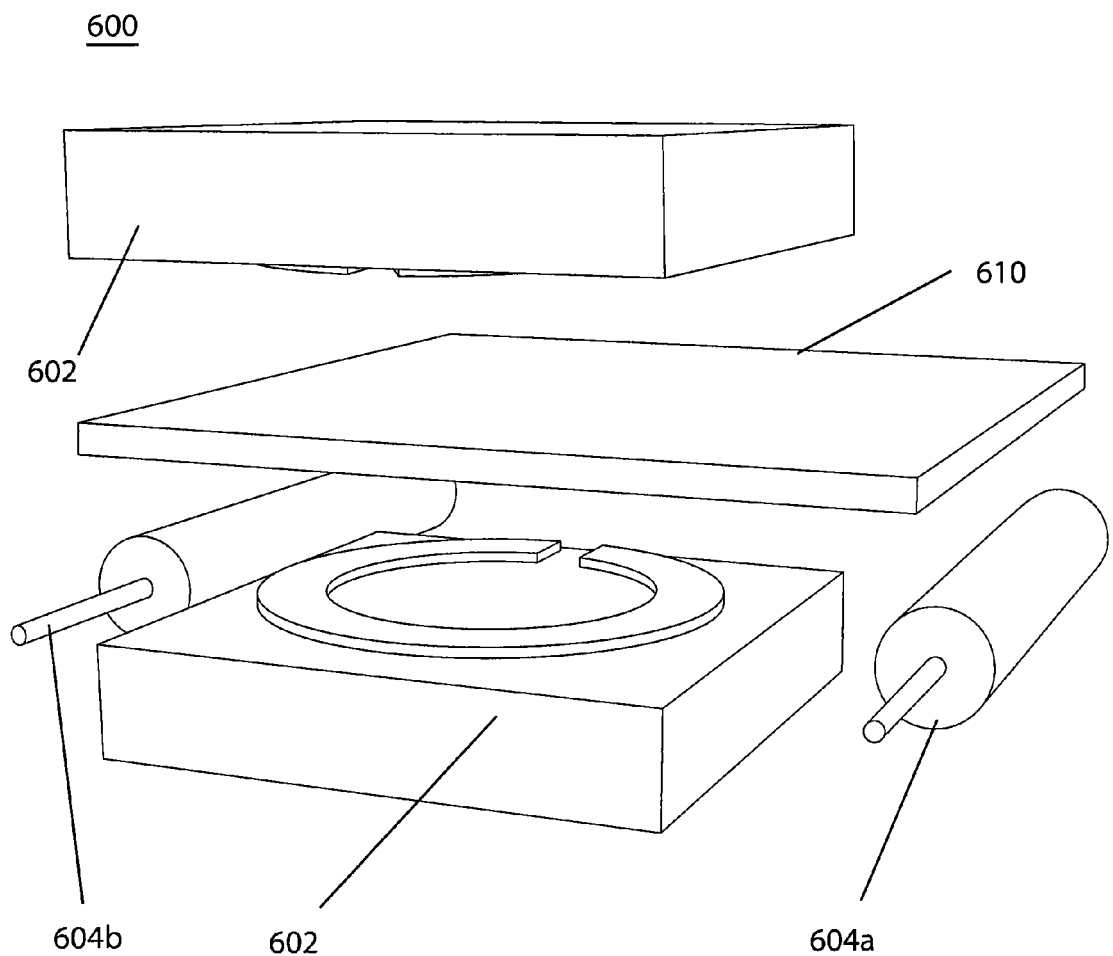

FIGS. 6A and 6B are diagrams illustrating an exemplary system 600 for use in detecting electromagnetic wave permittivity and/or permeability in accordance with aspects of the present invention. The permittivity and permeability may optimally be in the microwave or radio-wave range; however, it is contemplated that system 600 may be usable to detect or transmit electromagnetic wave permittivity and/or permeability outside of the microwave or radio-wave range. As a general overview, system 600 includes an inductive device 602 and antennas 604. Inductive device 602 may be an inductive device substantially as described above with respect to inductive device 200. Antennas 604 are operable to transmit and receive an electromagnetic wave, respectively. Suitable electromagnetic wave antennas will be known to one of ordinary skill in the art from the description herein. Additional details of system 600 are provided below.

In an exemplary embodiment, one of antennas 604a emits a continuous electromagnetic wave, and the other antenna 604b receives the electromagnetic wave. The electromagnetic wave transmission between antennas 604 is then measured while the frequency of the electromagnetic wave is swept. The transmission may be measured, for example, with a conventional network analyzer. As the frequency of the electromagnetic wave approaches the resonant frequency of inductive device 602, the transmission of the electromagnetic wave will decrease, due to absorption of the electromagnetic wave by inductive device 602. Thus, one may determine both the resonant frequency and line-width of inductive device 602 by sweeping the microwave frequency that is transmitted between antennas 604 and monitoring the transmission.

The resonant frequency of inductive device 602 is dependent at least in part on the effective inductance and capacitance of inductive device 602. As set forth above, it has been determined that the inductance of inductive device 602 depends on the permeability near inductive device 602, while the capacitance of inductive device 602 depends on the permittivity near inductive device 602. Accordingly, when an object 610 approaches system 600, inductive device 602 may experience a shift in resonant frequency or a broadening in resonant frequency line-width. The shift or broadening in the resonant frequency of inductive device 602 may be monitored by antennas 604, as described above. This shift or broadening is indicative of the permittivity and/or permeability of the object 610. Derivation of the electromagnetic wave permittivity and/or permeability of object 610 based on the change in resonant frequency of inductive device 602 will be understood to one of ordinary skill in the art from the description herein.

Additionally, in order to achieve broadband permeability or permittivity detection, one may use an inductive device 602 having a tunable capacitors (as described above), or use an array of inductive devices 602 with different resonance frequencies. Further, it may be desirable to insert a spacing material with known permittivity/permeability in between the object to be detected and the inductive device 602.

While only one inductive device 602 is illustrated in FIG. 6A, it will be understood by one of ordinary skill in the art from the description herein that the invention is not so limited. System 600 may comprise at least a pair of inductive devices 602 positioned on either side of the object to be detected 610, as shown in FIG. 6B. In this embodiment, the permittivity and permeability may be determined by scanning the pair along the area of the object to be imaged. The permittivity and permeability may then be obtained based on the electromagnetic waves transmitted between the inductive device pairs or reflected off of the object to be imaged 610, as described above with reference to system 500. This may be desirable for applications requiring the high sensitivity detection of electromagnetic wave permittivity and permeability, e.g., for ultra-thin objects.

Additionally, system 600 may be usable for surface imaging. By scanning 600 along the surface of an object, the surface topography of the object 610 may be determined based on the detected changes in permittivity and permeability near inductive device 602.

Figure 7:
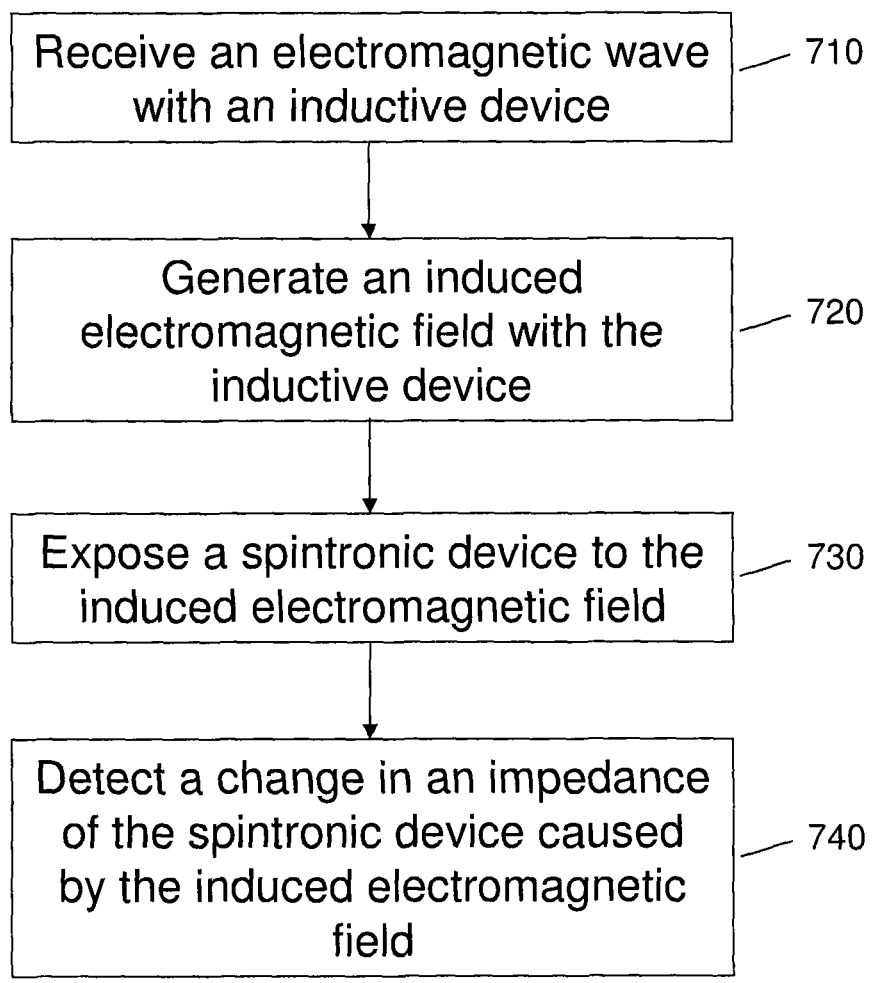
FIG. 7 is a flowchart illustrating an exemplary method for detecting an electromagnetic wave in accordance with aspects of the present invention.

FIG. 7 is a flow chart illustrating an exemplary method 700 for detecting an electromagnetic wave in accordance with aspects of the present invention. The electromagnetic wave may optimally be in the microwave or radio-wave range;

however, it is contemplated that method 700 may be usable to detect electromagnetic radiation outside of the microwave or radio-wave range. As a general overview, method 700 includes receiving an electromagnetic wave with an inductive device, generating an induced electromagnetic field, exposing a spintronic device to the induced electromagnetic field, and detecting a change in an impedance of the spintronic device. Additional details of method 700 are provided below. For the purposes of illustration, method 700 will be described herein with respect to the components of system 300.

In step 710, an electromagnetic wave is received. In an exemplary embodiment, inductive device 302 receives an electromagnetic wave to be detected by system 300.

In step 720, an induced electromagnetic field is generated. In an exemplary embodiment, the electromagnetic wave induces a resonating current in inductive device 302, as described above. The resonating current generates an induced electromagnetic field that corresponds to the received electromagnetic wave.

In step 730, a spintronic device is exposed to the induced electromagnetic field. In an exemplary embodiment, spintronic device 304 is positioned adjacent a surface of the annulus of inductive device 302, as set forth above. Accordingly, spintronic device 304 is exposed to the induced electromagnetic field from inductive device 302.

In step 740, a change in the impedance of the spintronic device is detected. In an exemplary embodiment, exposure of spintronic device 304 to the induced electromagnetic field causes a change in the relative angle between the fixed and unfixed magnetization directions of spintronic device 304. In turn, this causes a change in the impedance of spintronic device 304, which is dependent on the relative angle. Detector 308 detects the change in impedance of spintronic device 304 caused by the induced electromagnetic field, which is indicative of the electromagnetic wave received by inductive device 302.

It will be understood to one of ordinary skill in the art that method 700 is not limited to the above-described steps. For example, method 700 may include the step of detecting a magnitude of the change in impedance of the spintronic device. As described above, the magnitude of the change in impedance of spintronic device 304 may be indicative of the frequency of the electromagnetic wave received by inductive device 302. For another example, method 700 may include the step of detecting interference in the change in impedance of the spintronic device. As described above, when reference electromagnetic wave source 310 applies a reference electromagnetic wave to spintronic device 304, interference may be created that is indicative of the phase of the electromagnetic wave received by inductive device 302. Additional or alternative steps for method 700 will be understood by one of ordinary skill in the art from the description herein.

Figure 8:
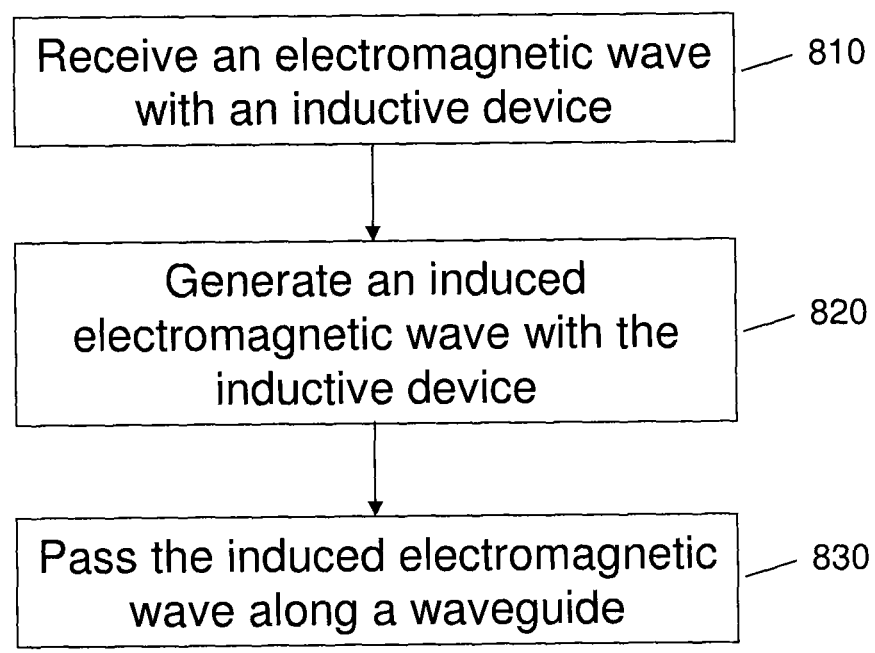
FIG. 8 is a flowchart illustrating an exemplary method for detecting or transmitting an electromagnetic wave in accordance with aspects of the present invention.

FIG. 8 is a flow chart illustrating an exemplary method 700 for detecting an electromagnetic wave in accordance with aspects of the present invention. The electromagnetic wave may optimally be in the microwave or radio-wave range; however, it is contemplated that method 800 may be usable to detect electromagnetic radiation outside of the microwave or radio-wave range. As a general overview, method 800 includes receiving an electromagnetic wave with an inductive device, generating an induced electromagnetic wave, and passing the induced electromagnetic wave along a waveguide of a conductive device. Additional details of method 800 are provided below. For the purposes of illustration, method 800 will be described herein with respect to the components of system 500.

In step 810, an electromagnetic wave is received. In an exemplary embodiment, inductive device 504 receives an electromagnetic wave to be detected by system 500.

In step 820, an induced electromagnetic wave is generated. In an exemplary embodiment, the electromagnetic wave induces a resonating current in inductive device 504, as described above. The resonating current generates an induced electromagnetic wave that corresponds to the received electromagnetic wave.

In step 830, the induced electromagnetic wave is passed along a waveguide. In an exemplary embodiment, conductive device 502 passes the induced electromagnetic wave along the waveguide defined by the inner conductive wire and the outer conductive cylinder. Conductive device 502 may pass the induced electromagnetic wave to separate electrical components (not shown) for detection, processing, and/or analysis.

It will be understood to one of ordinary skill in the art that method 800 is not limited to the above-described steps. In particular, method 800 may alternatively include the following steps for transmitting an electromagnetic wave into free space as opposed to detecting an electromagnetic wave. For example, conductive device 502 may transmit an electromagnetic wave along the waveguide to inductive device 504. Inductive device 504 then absorbs the transmitted electromagnetic wave. As set forth above, the absorption of the electromagnetic wave may be dependent on the resonant frequency of inductive device 504 and the frequency of the transmitted electromagnetic wave. Then, inductive device 504 generates an induced electromagnetic field corresponding to the absorbed electromagnetic wave. Thus, method 800 may be usable to transmit electromagnetic waves into free space.

Figure 9:
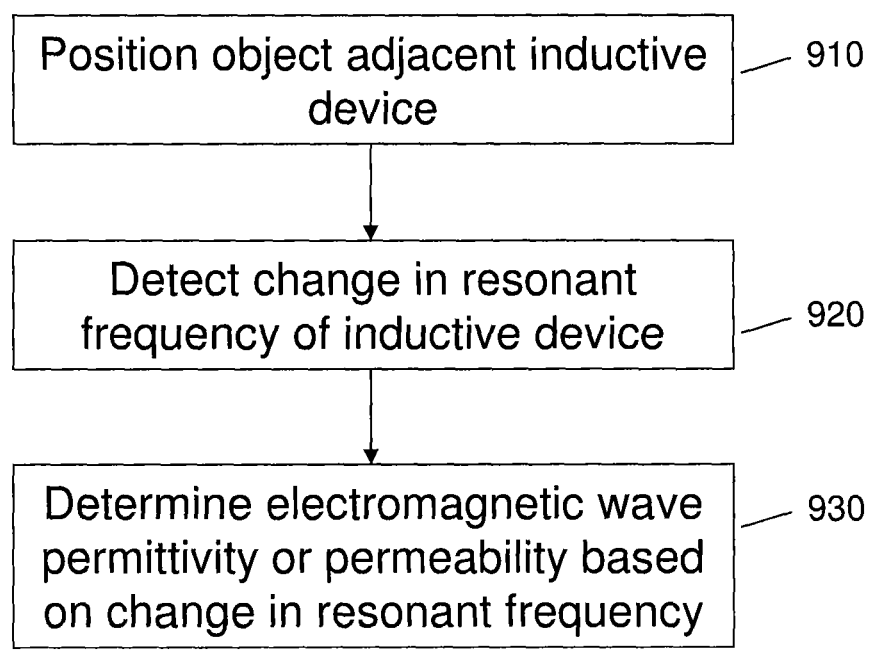
FIG. 9 is a flowchart illustrating an exemplary method for detecting electromagnetic wave permittivity and/or permeability in accordance with aspects of the present invention.

FIG. 9 is a flow chart illustrating an exemplary method 700 for detecting electromagnetic wave permittivity or permeability in accordance with aspects of the present invention. The electromagnetic wave may optimally be in the microwave or radio-wave range; however, it is contemplated that method 900 may be usable to detect electromagnetic radiation outside of the microwave or radio-wave range. As a general overview, method 900 includes positioning an object adjacent an inductive device, detecting a change in resonant frequency of the inductive device, and determining an electromagnetic wave permittivity or permeability of the object. Additional details of method 900 are provided below. For the purposes of illustration, method 900 will be described herein with respect to the components of system 600.

In step 910, an object is positioned adjacent an inductive device. In an exemplary embodiment, the object to be detected 610 is positioned adjacent inductive device 602.

In step 920, a change in the resonant frequency of the inductive device is detected. In an exemplary embodiment, antennas 604 are used to detect a change in resonant frequency of inductive device 602. As described above, the resonant frequency of inductive device 602 may be determined based on the electromagnetic wave transmission between antennas 604 over a range of frequencies. When the electromagnetic wave transmission is at a minimum, the frequency of the electromagnetic wave may substantially match the resonant frequency of inductive device 602. This process may further be used to detect a change or broadening in the resonant frequency of inductive device 602 caused by object 610.

In step 930, the electromagnetic wave permittivity or permeability of the object is determined. In an exemplary embodiment, the electromagnetic wave permittivity or permeability of object to be imaged 610 is determined based on the change in resonant frequency of inductive device 602. As set forth above, the change in resonant frequency is indicative of the permittivity and/or permeability of the object 610. Derivation of the electromagnetic wave permittivity and/or permeability of object 610 based on the change in resonant frequency of inductive device 602 will be understood to one of ordinary skill in the art from the description herein.

The disclosed systems and methods provide advantages over conventional electromagnetic wave detection systems and described below.

Use of the disclosed inductive devices in systems and methods for detecting electromagnetic waves enables improved electromagnetic wave imaging and non-destructive detection by allowing for relative small systems having stronger resonances. The disclosed systems and methods may achieve better spatial resolution than conventional detectors for electromagnetic wave imaging and non-destructive detection due to their decreased size.

Additionally, due to the unique properties of the disclosed spintronic devices and the resonance properties of the inductive devices, their combination of provides for improved free space electromagnetic wave detection that far exceeds the abilities of the devices by themselves.

The exemplary systems and methods are usable to provide electromagnetic wave detectors that are both sensitive and robust, and have a good frequency sensitivity. The exemplary systems and methods may provide a miniature size free space electromagnetic wave detector that has the ability to detect the electromagnetic wave phase. The exemplary systems and methods provide for electromagnetic wave imaging and non-destructive detection having relatively improved spatial resolution with respect to conventional systems.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A system for use in detecting an electromagnetic wave, comprising:
    an inductive device that generates an induced electromagnetic field when the inductive device receives the electromagnetic wave; and
    a spintronic device positioned adjacent the inductive device, the spintronic device comprising:
        a first magnetic layer having a fixed magnetization direction;
        a second magnetic layer having an unfixed magnetization direction; and
        a barrier layer positioned between the first and second magnetic layers,
    wherein the spintronic device has an impedance that changes when exposed to the induced electromagnetic field from the inductive device, the change in impedance indicative of the electromagnetic wave received by the inductive device,
    the impedance of the spintronic device is dependent on a relative angle between the fixed magnetization direction and the unfixed magnetization direction, and
    exposure of the spintronic device to the induced electromagnetic field from the inductive device causes a precession of the unfixed magnetization direction, thereby causing a periodic change in the relative angle between the fixed magnetization direction and the unfixed magnetization direction.

2. The system of claim 1, wherein the change In the relative angle causes the change in the impedance of the spintronic device, the system further comprising:
    a detector configured to measure the change in the Impedance of the spintronic device.

3. The system of claim 2, wherein the magnitude of the change in impedance of the spintronic device is indicative of the frequency of the electromagnetic wave received by the inductive device.

4. The system of claim 2, further comprising:
    a reference electromagnetic wave source configured to apply a reference electromagnetic wave to the spintronic device,
    wherein the reference electromagnetic wave interferes with the change in the impedance of the spintronic device caused by the induced electromagnetic field, and
    wherein the interference is indicative of the phase of the electromagnetic wave received by the inductive device.

5. The system of claim 1, wherein the relative angle between the fixed magnetization direction and the unfixed magnetization direction is initially configured to be approximately 90 degrees.

6. The system of claim 5, wherein the spintronic device is positioned adjacent a point on the inductive device at which a product of an induced magnetic field of the induced electromagnetic field and an induced electric field of the induced electromagnetic field is at a maximum.

7. The system of claim 1, wherein the relative angle between the fixed magnetization direction and the unfixed magnetization direction is initially configured to be one of approximately 0 degrees and approximately 180 degrees, and further comprising:
    a power source configured to apply a voltage across the spintronic device.

8. The system of claim 7, wherein the spintronic device is positioned adjacent a point on the inductive device at which an induced magnetic field of the induced electromagnetic field is at a maximum.

9. A system for use in detecting an electromagnetic wave, comprising:
    an inductive device that generates an induced electromagnetic field when the inductive device receives the electromagnetic wave; and
    a plurality of spintronic devices, the plurality of spintronic devices connected with each other in series, each of the spintronic devices positioned adjacent a surface of the inductive device, each of the spintronic devices comprising:
        a first magnetic layer having a fixed magnetization direction;
        a second magnetic layer having an unfixed magnetization direction; and
        a barrier layer positioned between the first and second magnetic layers,
    wherein each spintronic device has an impedance that changes when exposed to the induced electromagnetic field from the inductive device, the change in impedance indicative of the electromagnetic wave received by the inductive device,
    the impedance of each spintronic device is dependent on a relative angle between the fixed magnetization direction and the unfixed magnetization direction, and
    exposure of each spintronic device to the induced electromagnetic field from the inductive device causes a change in the relative angle between the fixed magnetization direction and the unfixed magnetization direction.

10. The system of claim 9, wherein the spintronic devices are positioned adjacent respective points on the inductive device at which the induced electromagnetic field differs in amplitude.

11. The system of claim 1, wherein the inductive device comprises an annulus of conductive material, the annulus including a gap.

12. The system of claim 11, wherein the spintronic device is positioned adjacent a surface of the annulus.

13. A method for detecting an electromagnetic wave, comprising the steps of:
receiving the electromagnetic wave with an inductive device;
generating an induced electromagnetic field with the Inductive device, the induced electromagnetic field corresponding to the received electromagnetic wave;
exposing a spintronic device to the induced electromagnetic field from the inductive device, the spintronic device comprising a first magnetic layer having a fixed magnetization direction, a second magnetic layer having an unfixed magnetization direction; and a barrier layer positioned between the first and second magnetic layers; and
detecting a periodic change in an impedance of the spintronic device caused by the induced electromagnetic field caused by a precession of the unfixed magnetization direction, the change in the impedance indicative of the electromagnetic wave received by the inductive device.

14. The method of claim 13, wherein the detecting step comprises:
detecting a magnitude of the change in impedance of the spintronic device caused by the induced electromagnetic field, the magnitude indicative of the frequency of the electromagnetic wave received by the inductive device.

15. The method of claim 13, further comprising the step of:
applying a reference electromagnetic wave to the spintronic device;
wherein the detecting step comprises:
detecting interference in the change in the impedance of the spintronic device caused by the induced electromagnetic field, the interference indicative of the phase of the electromagnetic wave received by the inductive device.

* * * * *